Dec. 17, 1957 G. H. TOWNER 2,817,062

SIGNAL FREQUENCY CONVERTER

Filed April 2, 1954 2 Sheets-Sheet 1

INVENTOR:
George H. Towner

By Herbert E. Metcalf
His Patent Attorney

Dec. 17, 1957 G. H. TOWNER 2,817,062

SIGNAL FREQUENCY CONVERTER

Filed April 2, 1954 2 Sheets-Sheet 2

INVENTOR:
George H. Towner

By Herbert E. Metcalf
His Patent Attorney

United States Patent Office 2,817,062

Patented Dec. 17, 1957

2,817,062

SIGNAL FREQUENCY CONVERTER

George H. Towner, San Diego, Calif., assignor to Northrop Aircraft, Inc., Hawthorne, Calif., a corporation of California Application April 2, 1954, Serial No. 420,644

3 Claims. (Cl. 332—52)

This invention relates to frequency conversion means and, more particularly, to a frequency converting circuit especially suited for servo work.

In electronic art, applications of frequency conversion means are manifold, as in the operation of low frequency servomotors from an error signal of a higher frequency, for example, or in the adaptation of different frequency precision instruments to a central frequency source. Prior means for signal frequency conversion as mixer type converters and ordinary modulators and their demodulators, for example, presented problems of undesired time lag introduced into the output, circuit complexity and poor reliability for use in servo systems.

It is, accordingly, an object of this invention to provide a frequency conversion circuit that is simple in construction, reliable in operation and which causes a minimum amount of inherent time lag (delay) to an input signal.

It is a further object of this invention to provide a frequency conversion circuit which prevents input quadrature signal components from appearing in the output as quadrature signals of the new frequency.

Briefly, the invention comprises two diodes connected in series across two transformer secondaries which are (resistively) coupled back-to-back. The secondaries have center taps connected to ground and the junction of the two diodes is resistively connected to an input signal source. A reference voltage of the input signal frequency is applied to the primary of one of these transformers and a reference voltage of an output frequency is applied to the other transformer primary. These two reference frequency voltages are of equal magnitude. The two diodes serve effectively as switches, their conduction status being governed by the reference frequencies which modulate the input signal. An output signal is derived across a resistance which is serially coupled by a capacitance to the junction of the two diodes. This output signal is converted into a sine wave by means of a resonant circuit in the plate circuit of an amplifier tube connected across the resistance. Only one transformer can be used but this requires that the two reference frequency voltage sources be connected in series across the transformer primary.

Other features and objects of the invention will be more clearly recognized from reference to the following specification and accompanying drawings in which.

Figure 1:
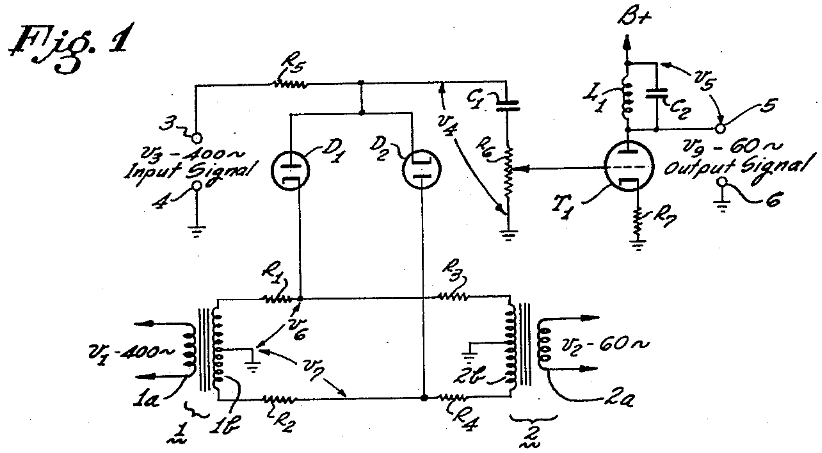
Figure 1 is a circuit diagram of a preferred embodiment of the present invention.

Reference is first made to the circuit diagram of Figure 1. A transformer 1 has a primary 1$a$ connected to a voltage source providing a 400 C. P. S. reference voltage $v_1$. Another transformer 2 has a primary 2$a$ connected to another voltage source which provides a 60 C. P. S. reference voltage $v_2$ equal in magnitude to $v_1$. These two transformers 1 and 2 have respective center tapped secondaries 1$b$ and 2$b$ of the same turn ratio in which the center taps are both connected to ground as shown. A resistance $R_1$, is connected to one end of secondary 1$b$ and another resistance $R_2$ is connected to the other end thereof. Similarly, resistance $R_3$ is connected to one end of secondary 2$b$ and resistance $R_4$ connected to the other end. Secondaries 1$b$ and 2$b$ are coupled back-to-back by connecting the free ends of resistances $R_1$ to $R_3$ and $R_2$ to $R_4$.

An input signal $v_3$ is provided at input terminals 3 and 4, of which terminal 4 can be connected to ground. Input signal $v_3$ is a 400 C. P. S. signal which can vary in magnitude and is to be converted into a 60 C. P. S. output signal. This output signal ($v_9$) is the result of in-phase components of the input signal only, because input quadrature signal components are suppressed from the output by means of two diodes $D_1$ and $D_2$ connected effectively as discriminating switches. The plate of $D_1$ and the cathode of $D_2$ are connected together to terminal 3 through an isolating resistance $R_5$. The cathode of $D_1$ is connected to the common junction of resistances $R_1$ and $R_3$ while the plate of $D_2$ is connected to the common junction of resistances $R_2$ and $R_4$ as shown.

The plate of $D_1$ and cathode of $D_2$ is connected to a resistance $R_6$ through a coupling capacitance $C_1$. The other end of resistance $R_6$ is connected to ground, and a tap on $R_6$ is directly connected to the grid of a tube $T_1$ as shown. Tube $T_1$ is suitably biased by cathode resistance $R_7$ and the plate of $T_1$ is connected to B+ through a coil $L_1$ which is shunted by a capacitance $C_2$ to form a resonant 60 C. P. S. circuit. Output signal $v_9$ is secured across terminals 5 and 6, terminal 5 being connected to the plate of $T_1$ and terminal 6 connected to ground.

Figure 2:
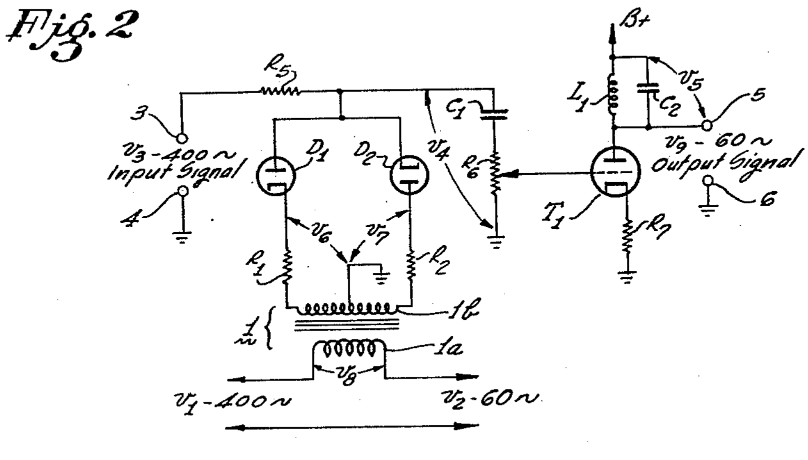
Figure 2 is a circuit diagram of the invention wherein only a single transformer is employed.

Referring now to Figure 2, there is shown a slightly modified circuit wherein only one transformer is required. This circuit is identical to Figure 1 in which transformer 2 including resistances $R_3$ and $R_4$ have been deleted. However, the voltage source providing the reference 60 C. P. S. signal $v_2$ must be connected in series with the voltage source which provides the reference 400 C. P. S. signal $v_1$. The same designations for Figure 1 are retained on Figure 2, including the several different voltage identifying notations which indicate that these same waveforms, as shown in Figure 3, applies to both circuits.

Figure 3:
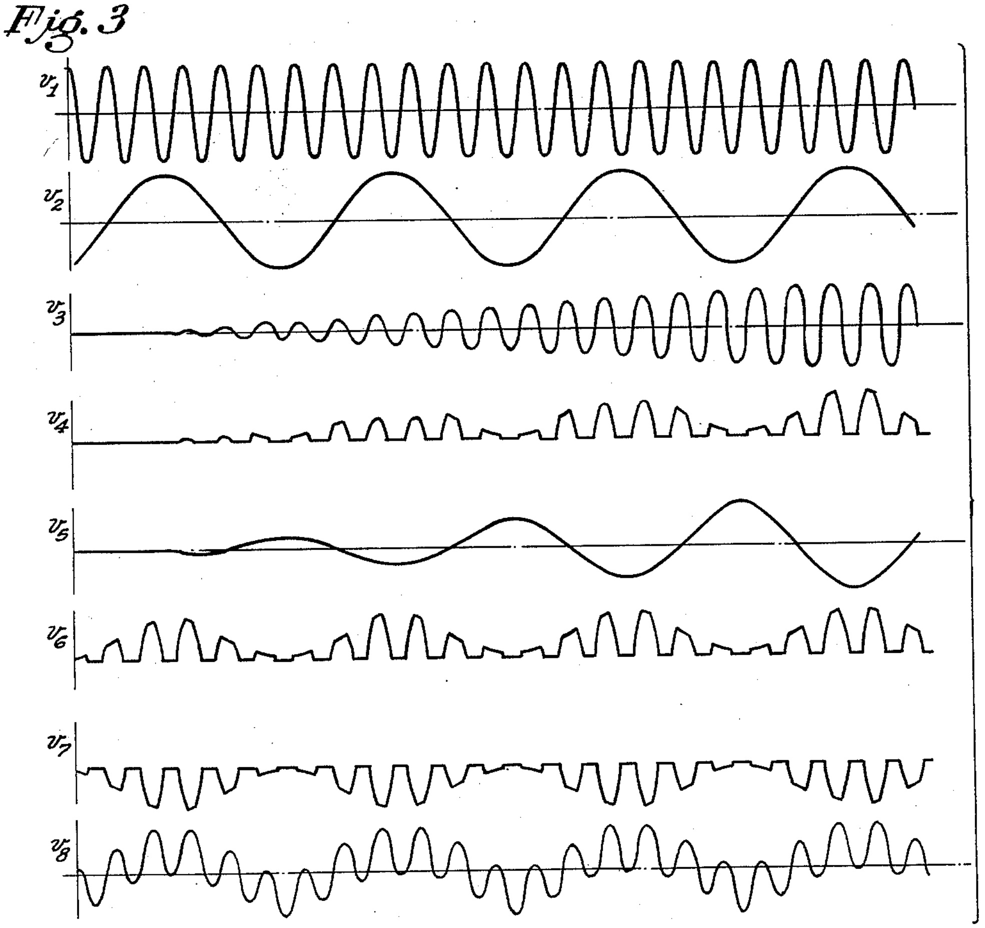
Figure 3 is a composite graph showing a series of waveforms which illustrate circuit response of the invention to a gradually increasing input signal.

In Figure 3, there are shown eight separate graphs having curves plotted on abscissas of the same time scale. The different graphs are labeled $v_1$, $v_2$, $v_3$, $v_4$, $v_5$, $v_6$, $v_7$ and $v_8$ corresponding to voltage identification on both Figures 1 and 2. The first graph labeled $v_1$ shows a constant magnitude 400 C. P. S. voltage wave and the second graph $v_2$ shows a 60 C. P. S. wave of the same magnitude. These two voltages are applied to the primaries of transformers 2 and 1, respectively, in Figure 1. In Figure 2, however, these voltages are applied in series to the primary of transformer 1. The next graph of $v_3$, shows a linearly increasing magnitude input signal in phase with $v_1$ provided across terminals 3 and 4, this example input signal attaining a constant magnitude as indicated. With this input signal ($v_3$) impressed across terminals 3 and 4, voltage $v_4$ between the common junction of diodes $D_1$ and $D_2$ to ground takes shape as given by the fourth graph of $v_4$. A series of gradually increasing peaks appear which are cut down or limited by a 60 C. P. S. envelope of $v_2$. When the magnitude of $v_3$ is small, the full 400 C. P. S. positive peaks of $v_4$ are undisturbed around the 60 C. P. S. positive peak points of an envelope of $v_2$ superimposed on $v_4$, but are reduced to zero at the negative peak points of the envelope. Negative peaks due to $v_3$ do not appear in $v_4$ because $v_1$ is in phase with $v_3$ and the negative $v_1$ peaks on diode $D_1$ cathode cause conduction which "shorts" out these portions from appearing at $v_4$. Consequently, $v_5$ is shown as a gradually increasing magnitude 60 C. P. S. wave which is the output signal provided to, for example, an A. C. servomotor. If the 400 C. P. S. signal phase of $v_3$ is changed 180°, the graph of $v_4$ turns upside down. The envelope of $v_4$ produces $v_5$ which, in turn, is essentially $v_9$.

The sixth graph, labeled $v_6$, is a plot of voltage between the cathode of $D_1$ and ground. A series of positive 400 C. P. S. peaks, limited by a 60 C. P. S. envelope, exists as shown. Similarly, the voltage waveform appearing between the plate of $D_2$ and ground is as shown in the following graph for $v_7$. The waveform $v_7$ is identical to $v_6$ except that the 400 C. P. S. peaks are negative and are limited by a 60 C. P. S. envelope below the abscissa. The last graph of Figure 3 is labeled $v_8$ and applies mainly to the circuit of Figure 3 and illustrates the superimposition of $v_1$ on $v_2$. This voltage $v_8$ is identified as the waveform across primary 1*a* but can represent the waveform for the transformed voltage across the secondary 1*b*.

Figure 4:
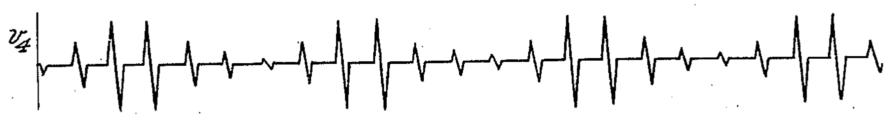
Figure 4 is a graph showing a waveform illustrating circuit output to a constant amplitude quadrature input signal.

A necessary requirement for a diode to conduct current is that the plate thereof be at a sufficiently higher positive voltage than the corresponding cathode. Careful examination of the circuit diagrams will reveal that this condition occurs during the times that $v_6$ and $v_7$ (Figure 3) are zero (spaces between pulses on the abscissa). To illustrate how quadrature signals in the input signal can be eliminated from the output, assume that the input signal differs by 90 degrees with the reference 400 C. P. S. signal $v_1$ and is of a constant magnitude. Thus, $v_3$ becomes a constant magnitude 400 C. P. S. signal which can lead or lag $v_1$ by 90 degrees. The output $v_4$ is shown for a lagging quadrature input signal. A leading input quadrature signal would result in a reversal of the half peaks; a negative chopped peak followed directly by a positive chopped peak. The crossover point between these chopped peak pairs correspond to maximum peak points on the 400 C. P. S. reference signal $v_1$ which are separated by 360 degrees. Whether the crossover points correspond to the maximum peak points of the positive halves or the negative halves, depends simply on transformer lead connections with the 400 C. P. S. signal source. Reversal of leads would cause crossover point correspondence to change from one to the other maximum point halves. From Figure 4, it is to be noted that the average output for $\frac{1}{60}$ second or longer is zero, hence the quadrature components are eliminated from the output. Two units of the invention could be operated, properly phased, to secure full wave rectification of input signal and hence derive a more nearly sinusoidal output to a resonant circuit.

Thus, a simple circuit for frequency conversion, eliminating quadrature components, has been described. It is to be understood, however, that the invention is not limited to the specific features shown, but that the means and construction herein disclosed comprise the preferred form of several modes of putting the invention into effect, and the invention is, therefore, claimed in any of its forms or modifications within the legitimate and valid scope of the appended claims.

What is claimed is:

1. Frequency conversion means, comprising: an input adapted to receive a signal of an input frequency; a first rectifier having a plate and a cathode; a second rectifier having a plate and a cathode; means connecting the plate of said first rectifier and the cathode of said second rectifier to one side of said input; output means connected to said connecting means for a signal of an output frequency; a first transformer having a primary and a center-tapped secondary; a second transformer having a primary and a center-tapped secondary; means for exciting the primary of said first transformer with a reference signal of said input frequency and the primary of said second transformer with another reference signal of said output frequency; means connecting the cathode of said first rectifier to an end of each secondary; means connecting the plate of said second rectifier to the other end of each secondary; and means connecting said center taps to the other side of said input.

2. Apparatus in accordance with claim 1 wherein said rectifiers are electronic diodes.

3. Apparatus in accordance with claim 1 wherein said output means includes an amplifier having a resonant network connected in the plate circuit thereof, said output signal being derived from said amplifier.

References Cited in the file of this patent

UNITED STATES PATENTS

| | | |
|---|---|---|
| 2,244,799 | Paddle | June 10, 1941 |
| 2,446,188 | Miller | Aug. 3, 1948 |